Figure 1:
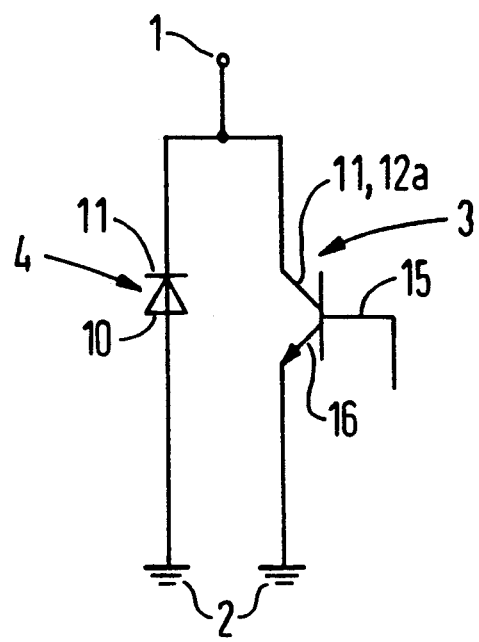

US005247201A

United States Patent [19]

Becker

[11] Patent Number: 5,247,201
[45] Date of Patent: Sep. 21, 1993

[54] INPUT PROTECTION STRUCTURE FOR INTEGRATED CIRCUITS

[75] Inventor: Burkhard Becker, München, Fed. Rep. of Germany

[73] Assignee: Siemens Aktiengesellschaft, Munich, Fed. Rep. of Germany

[21] Appl. No.: 893,569

[22] Filed: Jun. 3, 1992

Related U.S. Application Data

[63] Continuation of Ser. No. 656,480, Feb. 15, 1991, abandoned.

[30] Foreign Application Priority Data

Feb. 15, 1990 [DE] Fed. Rep. of Germany ....... 4004752

[51] Int. Cl.$^5$ ..................... H01L 29/06; H01L 29/78; H01L 29/72; H01L 23/48
[52] U.S. Cl. .................. 257/546; 257/355; 257/367; 257/577; 257/773
[58] Field of Search ............... 357/13, 23.13; 257/355-363, 367, 546, 577, 773

[56] References Cited

U.S. PATENT DOCUMENTS

| 4,100,561 | 1/1978 | Ollendorf | 357/23 |
| 4,291,319 | 7/1981 | Carinalli | 257/546 |
| 4,489,342 | 12/1984 | Mayrand | 257/355 |
| 4,697,202 | 8/1987 | Shey | 357/43 |

FOREIGN PATENT DOCUMENTS

| 0042581 | 12/1982 | European Pat. Off. | 357/23.13 |
| 60-98657 | 1/1985 | Japan | 257/546 |
| 63-229855 | 9/1988 | Japan | 357/23.13 |
| 1-293560 | 11/1989 | Japan | 357/23.13 |

OTHER PUBLICATIONS

D. C. Goldthorp et al., "An Integrated Circuit Composite PNPN Diode", *ISDAM* 1979, (Dec. 1979) pp. 180–183.

Primary Examiner—J. Carroll
Attorney, Agent, or Firm—Herbert L. Lerner; Laurence A. Greenberg

[57] ABSTRACT

An integrated circuit has an input, a terminal for a reference potential, and a semiconductor substrate. An input protection structure for the integrated circuit is disposed in the semiconductor substrate and is connected between the input and the terminal for a reference potential. The input protection structure includes at least one transistor and an integrated diode. The at least one transistor has a collector in the form of a buried zone connected to the input, an emitter in the form of at least one doped zone to be connected to the reference potential, the collector and emitter defining a collector-to-emitter path, and a base in the form of at least one doped zone being insulated except for electrical contact with the emitter and the collector. The integrated diode is formed by at least the buried zone and the semiconductor substrate and is connected parallel to the collector-to-emitter path of the transistor.

9 Claims, 2 Drawing Sheets

INPUT PROTECTION STRUCTURE FOR INTEGRATED CIRCUITS

This application is a continuation of application Ser. No. 656,480, filed Feb. 15, 1991, now abandoned.

The invention relates to an input protection structure for integrated circuits, which is disposed in a semiconductor substrate and includes at least one transistor and one integrated diode.

Integrated circuits require reliable protection against electrostatic discharges. To this end, they are provided with input protection structures. Some structures corresponding to the prior art are described in German Published, Non-Prosecuted Application DE-OS 36 16 394. Such prior art structures do not permit a fast and reliable protection against electrostatic discharges of both polarities.

It is accordingly an object of the invention to provide an input protection structure for integrated circuits, which overcomes the hereinafore-mentioned disadvantages of the heretofore-known devices of this general type and which enables fast, reliable protection against electrostatic discharges of both polarities.

With the foregoing and other objects in view there is provided, in accordance with the invention, in an integrated circuit having an input, a terminal for a reference potential, and a semiconductor substrate, an input protection structure for the integrated circuit being disposed in the semiconductor substrate and being connected between the input and the terminal for a reference potential, the input protection structure comprising at least one transistor having a collector in the form of a buried zone connected to the input, an emitter in the form of at least one doped zone to be connected to the reference potential, the collector and emitter defining a collector-to-emitter path, and a base in the form of at least one doped zone being insulated except for electrical contact with the emitter and the collector (floating base); and an integrated diode being formed by at least the buried zone and the semiconductor substrate and being connected parallel to the collector-to-emitter path of the transistor.

In accordance with another feature of the invention, the collector has a terminal, and the transistor has an emitter-to-base region being centrally symmetrically disposed around the terminal.

In accordance with a further feature of the invention, the transistor has an emitter-to-base region, and the collector has terminals being symmetrically disposed with respect to the emitter-to-base region of the transistor.

In accordance with an added feature of the invention, there are provided conductor tracks for making a course of potential within the base more homogeneous, the conductor tracks electrically contacting the doped zone forming the base and being insulated from all other structures of the protection structure.

In accordance with a concomitant feature of the invention, the integrated circuit is a bipolar integrated circuit having p-n insulation or oxide insulation of adjacent components.

Other features which are considered as characteristic for the invention are set forth in the appended claims.

Although the invention is illustrated and described herein as embodied in an input protection structure for integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
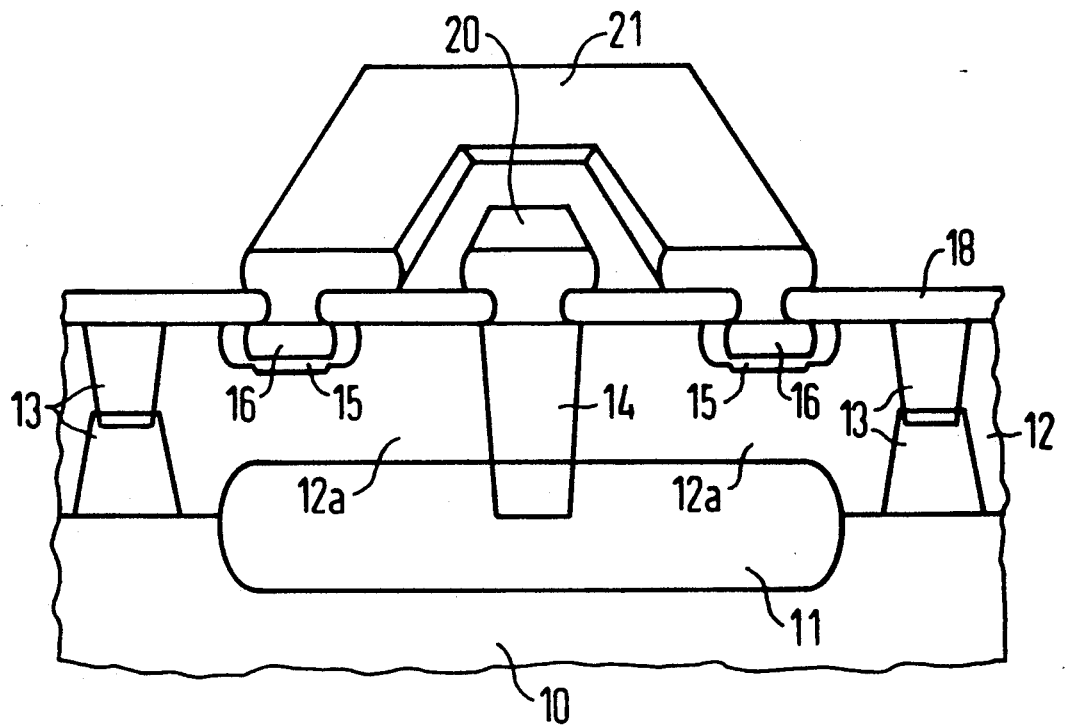
Figure 3:
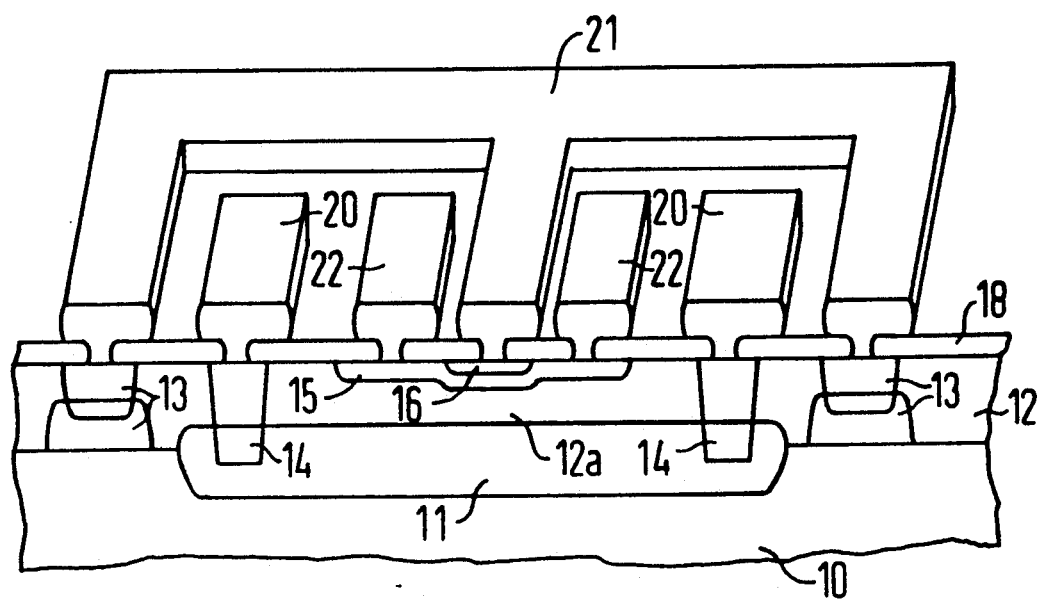
Figure 4:
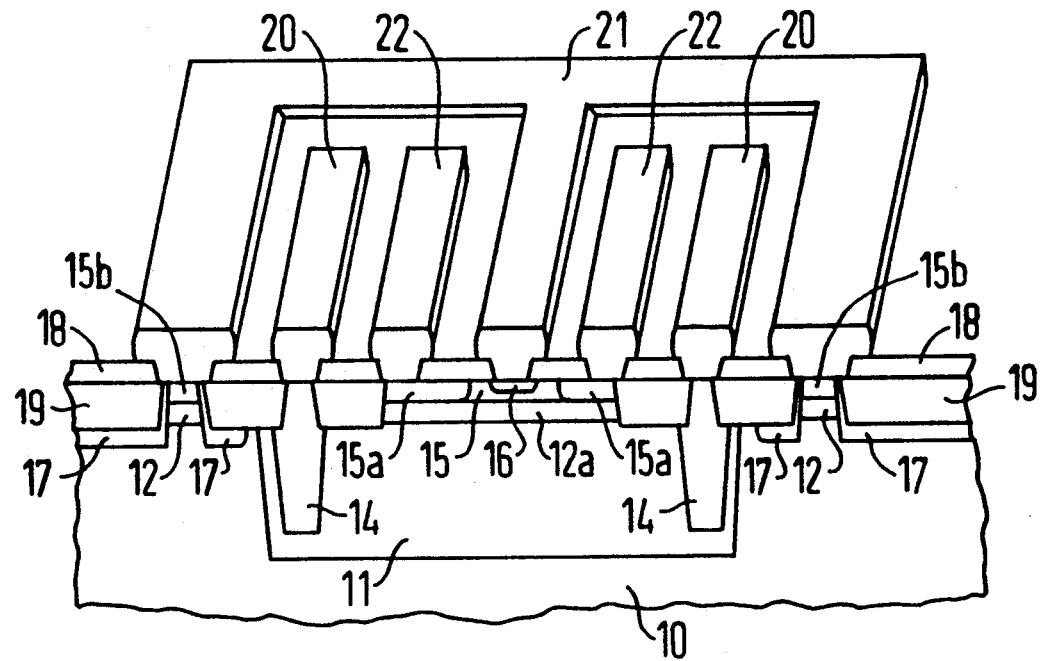

FIG. 1 is an equivalent or substitute schematic circuit diagram of an input protection structure having at least one transistor and one integrated diode according to the invention; and FIGS. 2–4 are fragmentary, diagrammatic, sectional and perspective views showing three versions of the embodiment of an input protection structure of FIG. 1 in a semiconductor system.

Referring now to the figures of the drawing in detail and first, particularly, to FIG. 1 thereof, there is seen a protection structure which is formed of a transistor 3 and a diode 4 connected parallel to the collector-to-emitter path of the transistor. The protection circuit is located between an input terminal 1 of an integrated circuit, in particular a bipolar integrated circuit, and a terminal for a reference potential 2, in particular a ground terminal. A collector 11, 12a of the transistor 3 and one pole 11 of the diode 4 are connected to the input terminal 1. An emitter 16 of the transistor 3 and another pole 10 of the diode 4 can be connected to the reference potential 2. A base 15 of the transistor 3 has no external terminal (in other words it has a floating base) and it only makes contact with the collector 11, 12a and the emitter 16.

FIGS. 2–4 show three exemplary embodiments of the construction of the protection structure according to the invention of in FIG. 1, but in a semiconductor system. Sectional views with additional perspective views toward the rear are used. The reference numerals match those of FIG. 1. In all three versions, a semiconductor substrate 10 being formed of silicon and having a first conduction type, for example p-conducting, is used as the base. In the course of a fabrication process for the protection structure, an epitaxial layer 12 of the opposite, second conduction type, which is accordingly preferably n-conducting, is applied by known methods on the semiconductor substrate 10. Another common feature of all the exemplary embodiments is a buried zone 11 of the second conducting type, which can be produced by conventional methods, such as implantation with an ensuing temperature step, like the other doped zone to be explained below.

In the first exemplary embodiment of FIG. 2, an insulation frame 13, including doped zones of the first conduction type, serves to insulate the entire protection structure from adjacent components (p-n insulation). This closed insulation frame 13 separates a portion 12a of the epitaxial layer 12 located in the interior of the frame from the remaining epitaxial layer 12 located outside the frame. The portion 12a together with the buried zone 11 forms the collector of the transistor 3 and is connected by means of a zone 14, in particular a highly doped zone of the same conducting type, which preferably but not necessarily extends as far as the interior of the buried zone 11. Disposed inside the portion 12a is a doped zone 15 of the first conduction type, which represents the base of the transistor 3, and disposed in turn inside the zone 15 is a doped zone 16 of the second conduction type, serving as the emitter of the transistor 3. According to the invention, the doped zones mentioned thus far are substantially centrally-symmetrically disposed. In other words, the highly doped zone 14 is located approximately in the middle of the portion 12a, and the zones 15 and 16 with one resting inside the other extend in frame-like fashion around the highly doped zone 14. The buried zone 11 is preferably dimensioned in such a way that under the zones or base-to-emitter ring 15, 16, it completely covers the region enclosed by this ring. The insulation frame 13 is disposed all around this entire protection structure. The surface of the semiconductor system is covered with an insulating layer 18, which has either been created in the preceding temperature steps or has been applied separately and preferably is formed of silicon oxide. The insulating layer 18 is structured in such a way that the highly doped zone 14 can be connected to a conductor track 20. A preferably annular opening also exists in the insulating layer 18, above the likewise annular zone 16 serving as the emitter. The emitter 16 can be connected to the reference potential 2 by a conductor track 21 through this opening. The surface of the zone 15 forming the base is completely covered by the insulating layer 18. The semiconductor substrate 10 has a ground terminal located outside the protection structure, so that the integrated diode 4 is provided by the buried zone 11 and the semiconductor substrate 10.

The second embodiment of FIG. 3 is likewise usable with p-n insulation of adjacent components (insulation frame 13) and is substantially equivalent to the first exemplary embodiment. However, an n-p-n standard component is used for the transistor 3, resulting in a more strip-like structure. The emitter 16 is disposed in the middle and the conductor track 21 providing it with electrical contact simultaneously serves to connect the semiconductor substrate 10 to the reference potential 2, through the insulation frame 13. The base 15 of the transistor 3 is disposed substantially symmetrically relative to the emitter 16 and can be connected to conductor tracks 22 through two correspondingly symmetrically formed openings in the insulating layer 18, as seen in FIG. 3. However, these two conductor tracks 22 are not also connected to the outside, but instead they are advantageously connected to one another. The conductor tracks 22 assure a homogeneous distribution of potential in the base region, but are not absolutely necessary. The collector formed in the buried zone 11 and the portion 12a of the epitaxial layer 12 has two terminals disposed substantially symmetrically with respect to the emitter 16 and including the highly doped zones 14, which do not necessarily extend into the interior of the buried zone 11. The collector is connected to the input 1 through the conductor tracks 20. The integrated diode 4 is formed by the buried zone 11 and the semiconductor substrate 10, which is connected in common with the emitter 16 to the reference potential 2, through the insulation frame 13 and the conductor track 21.

FIG. 4 shows an exemplary embodiment of the invention that is applicable to oxide insulation of adjacent components, using a standard n-p-n transistor. The transistor 3 is constructed substantially as in the second exemplary embodiment. The base 15 has two additional highly doped base contact zones 15a for connection to the conductor tracks 22. Insulating regions 19, which extend downward at least as far as the lower edge of the epitaxial layer 12, serve to insulate individual doped zones from one another and to insulate the entire protection structure from other components. Preferably, the insulating regions 19 are field oxide regions. Outside the input protection structure, the insulating regions 19 are surrounded by highly doped zones 17 of the first conduction type, which are known as so-called channel stoppers. In this case, these channel stopper zones 17 simultaneously serve to connect the semiconductor substrate 10 to the surface of the semiconductor system, where they make contact with the conductor track 21 and a highly doped zone 15b, which was produced simultaneously with the base contact zone 15a and therefore is likewise of the first conduction type. In this way, the semiconductor substrate 10 can be connected in common with the emitter 16 to the reference potential 2. The integrated diode 4, as in the preceding exemplary embodiments, is formed by the buried zone 11 and the semiconductor substrate 10 and it is connected between the input and reference potential by means of the conductor tracks 20 and 21.

The mode of operation of the input protection structure according to the invention depends on the special structure of the invention, as will be described below:

Negative voltages at the input 1 are shunted to the reference potential 2 through the diode 4 that is integrated with the protection structure. The sensitive base-to-emitter junction is polarized in the depletion direction, and it is noted that the centrally symmetrical layout of FIG. 2 is highly advantageous in this respect. Due to the annular, extended depletion layer, the load is distributed over a larger surface area of the emitter-to-base junction, thus compensating for the disadvantage that the only current leakage path is through the diode path. For this reason, the centrally symmetrical layout of FIG. 2 assures that the load capacity or protective action is the same for both voltage polarities, on the order of magnitude of many thousands of volts, even though the shunting of positive pulses (see below) is favored by nature, because of the prevailing transistor mode of operation in this case.

When there are positive pulses at the input 1, the transistor is in the normal operating range, so that the sensitive emitter-to-base junction is only lightly loaded. Since the base 15 is not connected, the pulse is shunted through a $U_{CEO}$ breakdown. The emitter-to-collector residual current $I_{CEO}$ is elevated by a factor $B+1$ (where B=current amplification) over a collector-to-base residual current $I_{CBO}$. This assures an early breakdown, before the voltage at the input has risen so much that it would cause destruction. The early avalanche breakdown promotes non-destructive shunting of the pulse.

Once again, the centrally symmetrical layout of FIG. 2 has a positive effect, which is that the large emitter surface area 16 increases the emitter effectiveness and thus promotes the shunting of the pulse. On the other hand, the large emitter surface area does not have any disadvantage in terms of elevating the additional capacitance, because for positive signal voltages only the junctions between the epitaxial layer and the base region and between the buried zone 11 and the substrate 10, in other words between regions having relatively weak doping, are decisive.

For integrated circuits with p-n insulation, the above discussion shows that the use of the structure of FIG. 2 is attractive. Besides the advantages of requiring little space and little additional capacitance and of having equally excellent protective action for both voltage polarities, it has merely the disadvantage of an elevated depletion current, because of the unconnected base region.

If a standard n-p-n transistor of FIG. 3 is used, the more-homogeneous distribution of potential within the base region, which is produced because of the conductor tracks 22 contacting the base 15, reduces the occurrence of local depletion layer breakdowns, which could lead to destruction because of the spatially limited power.

In integrated circuits with oxide insulation, the use of a symmetrical structure of FIG. 4 is appropriate. In this case the disadvantage of elevated depletion currents generally need not be expected. Advantageously, in this structure, two highly doped base contact zones 15a, which are disposed symmetrically relative to the emitter, are used. The contact zones 15a along with their conductor tracks 22 (not connected), contribute to making the potential distribution in the base zone 15 (which is generally weakly doped) more homogeneous.

The base contact zones 15a furthermore shorten the length of the depletion layer between the epitaxial layer and the base region (both regions are generally weakly doped) in the case of positive pulses, so that an avalanche breakdown does not lead to destruction unless high voltages are applied.

I claim:

1. In an integrated circuit having an input, a terminal for a reference potential, and a semiconductor substrate,
   an input protection structure for the integrated circuit being disposed in the semiconductor substrate and being connected between the input and the terminal for a reference potential, the input protection structure comprising:
   at least one transistor having a collector in the form of a buried zone connected to the input, an emitter in the form of at least one doped zone to be connected to the reference potential, said collector and emitter defining a collector-to-emitter path, and a base in the form of at least one doped zone being insulated except for electrical contact with said emitter and said collector, said collector having a terminal forming a center of symmetry, and said transistor having an emitter-to-base region symmetrically disposed around said terminal forming the center of symmetry; and
   an integrated diode being formed by at least said buried zone and the semiconductor substrate and being connected parallel to said collector-to-emitter path of said transistor.

2. The input protection structure according to claim 1, wherein the integrated circuit is a bipolar integrated circuit having p-n insulation of adjacent components.

3. The input protection structure according to claim 1, wherein the integrated circuit is a bipolar integrated circuit having oxide insulation of adjacent components.

4. The input protection structure according to claim 1, wherein said base is a floating base.

5. In an integrated circuit having an input, a terminal for a reference potential, and a semiconductor substrate,
   an input protection structure for the integrated circuit being disposed in the semiconductor substrate and being connected between the input and the terminal for a reference potential, the input protection structure comprising:
   at least one transistor having a collector in the form of a buried zone connected to the input, an emitter in the form of at least one doped zone to be connected to the reference potential, said collector and emitter defining a collector-to-emitter path, and a base in the form of at least one doped zone being insulated except for electrical contact with said emitter and said collector, said transistor having an emitter-to-base region, and said collector having terminals being symmetrically disposed with respect to said emitter-to-base region of said transistor; and
   an integrated diode being formed by at least said buried zone and the semiconductor substrate and being connected parallel to said collector-to-emitter path of said transistor.

6. The input protection structure according to claim 5, wherein the integrated circuit is a bipolar integrated circuit having p-n insulation of adjacent components.

7. The input protection structure according to claim 5, wherein the integrated circuit is a bipolar integrated circuit having oxide insulation of adjacent components.

8. The input protection structure according to claim 5, wherein said base is a floating base.

9. The input protection structure according to claim 5, including conductor tracks for making a course of potential within said base more homogeneous, said conductor tracks electrically contacting said doped zone forming said base and being insulated from all other structures of the protection structure.

* * * * *